United States Patent
Tropp et al.

(10) Patent No.: US 6,232,779 B1
(45) Date of Patent: May 15, 2001

(54) NMR RF COIL WITH IMPROVED RESONANT TUNING AND FIELD CONTAINMENT

(75) Inventors: James S. Tropp, Berkeley, CA (US); Eddy B. Boskamp, Menomonee Falls, WI (US)

(73) Assignee: General Electric Company, Waukesha, WI (US)

( * ) Notice: Subject to any disclaimer, the term of this patent is extended or adjusted under 35 U.S.C. 154(b) by 0 days.

(21) Appl. No.: 09/382,958

(22) Filed: Aug. 25, 1999

(51) Int. Cl.$^7$ .................................................. G01V 3/00
(52) U.S. Cl. ........................................... 324/322; 324/318
(58) Field of Search ..................................... 324/318, 322, 324/312, 314, 307, 309, 300

(56) References Cited

U.S. PATENT DOCUMENTS

| | | | |
|---|---|---|---|
| 4,680,548 | 7/1987 | Edelstein et al. | 324/318 |
| 4,746,866 | 5/1988 | Roschmann | 324/318 |
| 4,751,464 | 6/1988 | Bridges | 324/318 |
| 4,833,409 | * 5/1989 | Eash | 324/318 |
| 4,939,465 | * 7/1990 | Bielh et al. | 324/318 |
| 5,053,711 | * 10/1991 | Hayes et al. | 324/318 |
| 5,196,797 | 3/1993 | Tropp | 324/322 |
| 5,581,186 | * 12/1996 | Keller | 324/318 |

OTHER PUBLICATIONS

James Tropp, Mutual Inductance in the Bird–Cage Resonator in the Journal of Magnetic Resonance 126, 9–17; Received Jul. 2, 1996; Revised Feb. 21, 1997.

J. Thomas Vaughan et al., High Frequency Volume Coils for Clinical NMR Imaging and Spectroscopy in Magnetic Resonance Medicine 32, 206–218; Received Jul. 8, 1993; revised Mar. 12, 1994.

* cited by examiner

Primary Examiner—Louis Arana
(74) Attorney, Agent, or Firm—Quarles & Brady, LLP; Christan G. Cabou

(57) ABSTRACT

An RF coil assembly for an NMR instrument includes a cylindrical shield disposed concentrically about a central axis and a set of linear conductors disposed concentrically about the central axis and radially inward from the shield. Assembly further includes an annular member positioned to span the gap between the shield and linear conductors. The annular member includes an insulating substrate, a conductive layer over the substrate, and a series of non-conducting gaps through the conductive layer. One or more lumped element capacitors are connected across one or more of the gaps to tune to resonance.

13 Claims, 4 Drawing Sheets

NMR RF COIL WITH IMPROVED RESONANT TUNING AND FIELD CONTAINMENT

BACKGROUND OF THE INVENTION

This invention relates to nuclear magnetic resonance (NMR) apparatus. More specifically, this invention relates to radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons or neutrons. Due to the spin of the protons and neutrons, each such nucleus exhibits a magnetic moment, such that, when a sample composed of such nuclei is placed in a static, homogeneous magnetic field, $B_0$, a greater number of nuclear magnetic moments align with the field to produce a net macroscopic magnetization M in the direction of the field. Under the influence of the magnetic field $B_0$, the aligned magnetic moments precess about the axis of the field at a frequency which is dependent on the strength of the applied magnetic field and on the characteristics of the nuclei. The angular precession frequency, $\omega$, also referred to as the Larmor frequency, is given by the Larmor equation $\omega=\gamma B$ in which $\gamma$ is the gyromagnetic ratio (which is constant for each NMR isotope) and wherein B is the magnetic field ($B_0$ plus other fields) acting upon the nuclear spins. It will be thus apparent that the resonant frequency is dependent on the strength of the magnetic field in which the sample is positioned.

The orientation of magnetization M, normally directed along the magnetic field $B_0$, may be perturbed by the application of magnetic fields oscillating at or near the Larmor frequency. Typically, such magnetic fields designated $B_1$ are applied orthogonal to the direction of the $B_0$ field by means of RF pulses through a coil connected to an RF transmitting apparatus. Under the influence of RF excitation, magnetization M rotates about the direction of the $B_1$ field. In NMR studies, it is typically desired to apply RF pulses of sufficient magnitude and duration to rotate magnetization M into a plane perpendicular to the direction of the $B_0$ field. This plane is commonly referred to as the transverse plane. Upon cessation of the RF excitation, the nuclear moments rotated into the transverse plane precess around the direction of the static field. The vector sum of the spins forms a precessing bulk magnetization which can be sensed by an RF coil. The signals sensed by the RF coil, termed NMR signals, are characteristic of the magnetic field and of the particular chemical environment in which the nuclei are situated. In NMR imaging applications, the NMR signals are observed in the presence of magnetic-field gradients which are utilized to encode spatial information into the signals. This information is later used to reconstruct images of the object studied in a manner well-known to those skilled in the art.

In design of RF coils for use in whole-body NMR studies, it is advantageous to limit radiative RF magnetic field loss by containing the field within the imaging volume, to the extent possible. Additionally, it is known that RF coils employ capacitance appropriate for the given RF coil inductance to attain the desired resonant frequency. In this regard, it is desirable to permit adjustment of the capacitance while expending minimum time and effort in the task. U.S. Pat. No. 4,751,464 (the "'464 patent") to Bridges and U.S. Pat. No. 4,746,866 (the "'866 patent") to Röschmann recognize these design goals, but are limited in meeting them.

Referring to the '464 patent, a cavity resonator comprises a plurality of transmission lines aligned parallel to a common axis and magnetically coupled to produce an essentially uniform dipole magnetic field perpendicular to the axis. The transmission lines comprise two conductor lines, the first conductors being arranged inwardly of a second conductor common to all lines. The common conductor is concentrically arranged about the axis of the resonator, and constitutes a cylindrically-shaped shield to help contain the magnetic field within the cavity. However, the shield is open at its two ends, permitting undesirable radiative loss of magnetic field through the open ends.

The transmission lines of the '464 patent include capacitance for tuning to resonance. However, distributed capacitance is used, which is best understood by knowing what it is not—lumped element capacitance. Lumped element capacitance is provided by discrete capacitors. Distributed capacitance does not use discrete capacitors; rather its capacitance is inherent to design structure, meaning the capacitance is distributed across various parts of a structure which together provide electrical capacitance. In the '464 patent, those "parts" providing distributed capacitance consist of the ends of the first and second conductors which are bent to form a pair of plates having a dielectric disposed therebetween.

Impedance matching to resonance is well known to those skilled in the art, and yet to achieve the desired resonant frequency, one requires a precise amount of capacitance. As a matter of manufacturing practicality, this is a difficult requirement to meet when using distributed capacitance. To understand why, it is necessary to consider the nature of distributed and lumped capacitances. Lumped capacitance is provided by one or more discrete capacitors having a precise quantity of capacitance (within a selectable tolerance range). The nature or purpose of discrete capacitors consists, solely, of providing capacitance.

In contrast, the nature of distributed capacitance is multifunctional, as the structure providing distributed capacitance also serves as mechanical support. For example in the '464 patent, shield 12 and conductors 18 serve: 1) a mechanical support function, with its own design requirements; and 2) a distributed capacitance function, also having specific design limitations. It is difficult to manufacture structures serving such dual purposes, one of which is the provision of a precise quantity of capacitance. This is one of the inherent problems to the distributed capacitance offering of the '464 patent.

Another problem is that the distributed capacitance of the '464 patent is not adjustable. Variable capacitance is useful in a number of circumstances. For example, if the quantity of capacitance provided is incorrect for resonant operation at a desired frequency, then adjustment is desired. Similarly, if over time the resonant frequency changed due to structural changes in the resonator, then one would want to adjust the capacitance. Nevertheless, the distributed capacitance provided by the '464 patent is fixed, and often incorrectly so due to manufacturing complexities mentioned above.

The '866 patent attempts to solve the latter problem by providing variable distributed capacitance. Specifically, the '866 patent includes an outer conductor in which there is arranged a dielectric. Two inner conductors are arranged, in the dielectric. One or more of the inner conductors are displaceable, thereby forming a variable distributed capacitance between the inner displaceable conductor(s) and the outer conductor. The system of conductors is tuned or readjusted by displacement of one or more of the inner conductors.

While the '866 patent offers variable capacitance, it too has shortcomings. Specifically, in order to establish a desired capacitance for resonant operation, one needs to know where to move the inner conductor to create such capacitance. Additionally, even if the inner conductor is moved into the desired position, it needs to be held in place to maintain the proper capacitance for resonant operation. As a practical matter, this may be a difficult achievement because the resonator vibrates during operation, causing undesirable relative motion between the inner and outer conductors, thereby changing the distributed capacitance from that which is required for resonant operation.

What is needed is an apparatus which reduces radiative losses of the RF magnetic field, and which provides lumped element capacitance for resonant operation.

BRIEF SUMMARY OF THE INVENTION

The present invention includes an RF coil assembly for an NMR instrument. The RF coil assembly includes a cylindrical shield disposed concentrically about a central axis and a set of linear conductors disposed concentrically about the central axis and radially inward from the shield. The assembly further includes an annular member positioned to span a gap between the shield and linear conductors, and adapted to receive an end of each of the linear conductors. The annular member has an insulating substrate, a conductive layer over the substrate, and a series of non-conducting gaps through the conductive layer corresponding to respective linear conductors. One or more lumped element capacitors are connected across one or more of the gaps to tune to resonance.

DESCRIPTION OF THE PREFERRED EMBODIMENT

Figure 1:
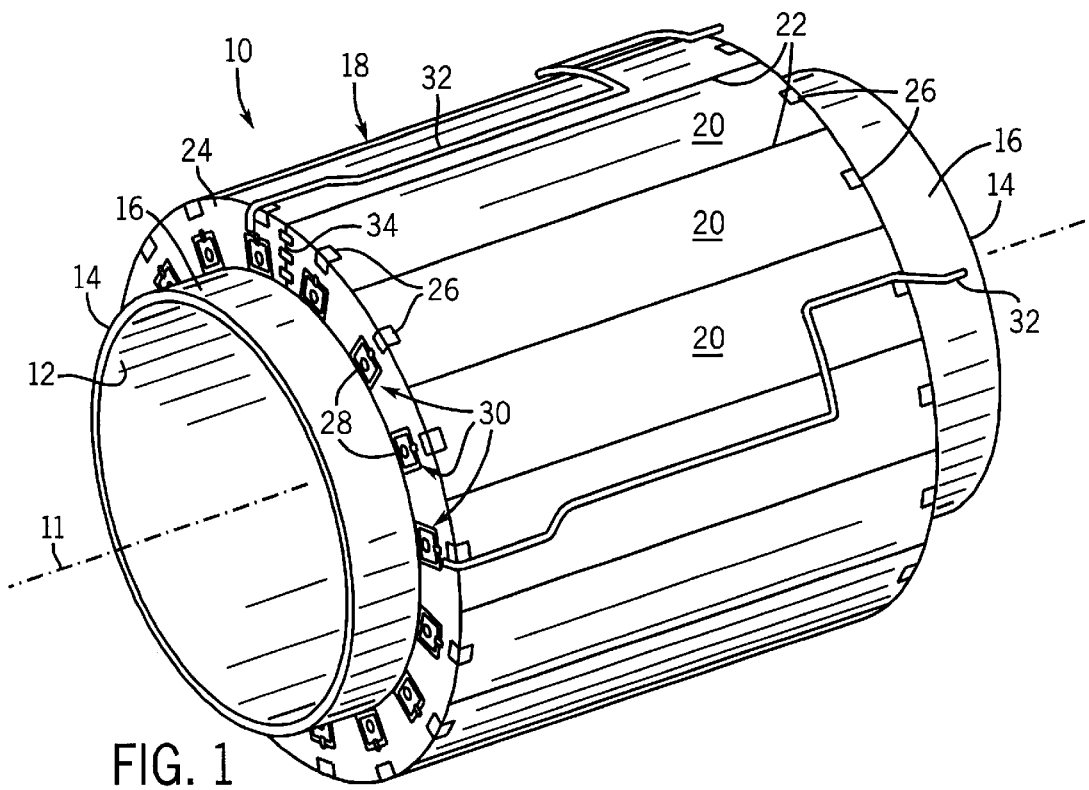
FIG. 1 is a perspective view of an RF coil assembly which incorporates the present invention.
Figure 2:
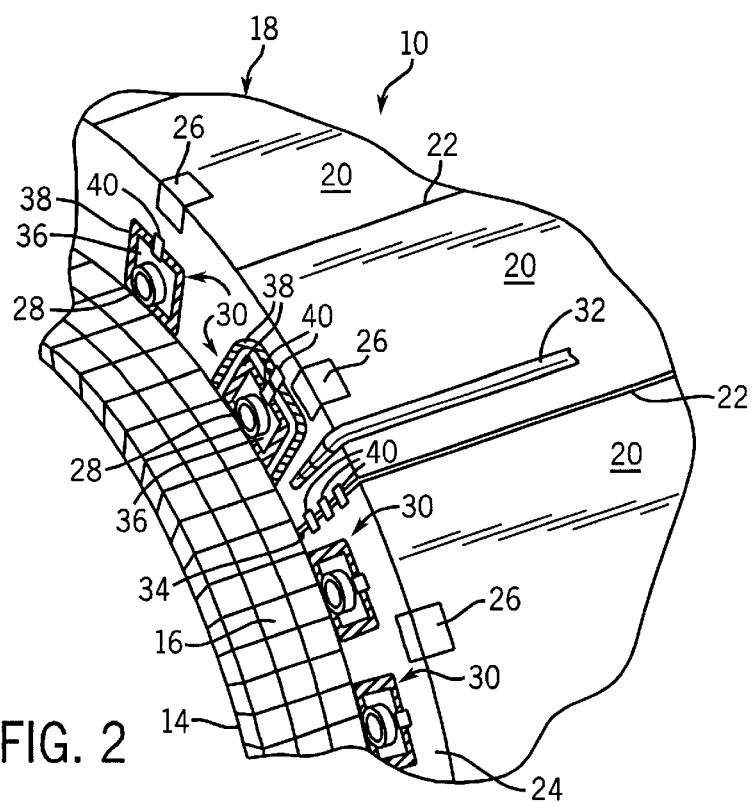
FIG. 2 is a close-up view of a portion of the assembly of FIG. 1.

Referring to FIGS. 1 and 2, an RF coil assembly 10 includes inner 12 and outer 18 cylinders, concentrically arranged with one another about central axis 11. The length of inner cylinder 12 extends beyond the ends of outer cylinder 18, producing a lip 14 at the front and back end of assembly 10 (i.e., the left and right ends of assembly 10, as respectively viewed in FIG. 1). An annular cavity in between inner 12 and outer 18 cylinders is capped off with a pair of annular members 24 at the front and back end of assembly 10. Each annular member 24 includes a bolt circle with sixteen equally-spaced apertures 42 (see FIG. 3) aligned to receive the ends of sixteen conductive rods 28 that extend between annular members 24.

Outer cylinder 18 comprises an inner tubular member (not shown) with an external shield 20 attached to the outer circumferential surface thereof. The inner tubular member is made from insulating material, like fiberglass or molded polyurethane, using conventional production techniques. Shield 20 is made from a thin conductive sheath of flexible circuit board material, such as RT duroid manufactured by the Rogers Corp. of Phoenix, Ariz.

RT duroid provides an insulating substrate with a conductive layer on one surface of the substrate. The substrate thickness is 0.005 inches (0.127 mm), and slots 22 are etched in axial fashion through the conductive layer to produce sixteen conductive panels, collectively representing shield 20. The RT duroid material is attached to the inner tubular member using any conventional technique, such as the application of adhesive in between the insulating substrate and the outer circumferential surface of the inner tubular member.

The conductive layer of shield 20 establishes an electric shield and, effectively, a ground plane for coil assembly 10. The slots 22 in shield 20 prevent the flow of gradient-induced eddy currents.

Inner cylinder 12 comprises a tubular member made from insulating material, such as fiberglass or molded polyurethane, using any conventional manufacturing technique. Each lip 14 has an outer circumferential surface 16, which may be used to mount a grounding strip (discussed below).

Referring to FIGS. 1–4, annular member 24 is sized to fit snugly in the annulus in between inner 12 and outer 18 cylinders, supporting cylinders 12 and 18 in coaxial arrangement. The outer circumferential edge of annular member 24 is attached to outer cylinder 18 using sixteen conductive tabs 26, one per conductive panel of shield 20. Conductive tabs 26 comprise any commercially available conducting adhesive strip. The inner circumferential edge of annular member 24 may be attached to inner cylinder 12 using an adhesive, or the like.

Figure 3:
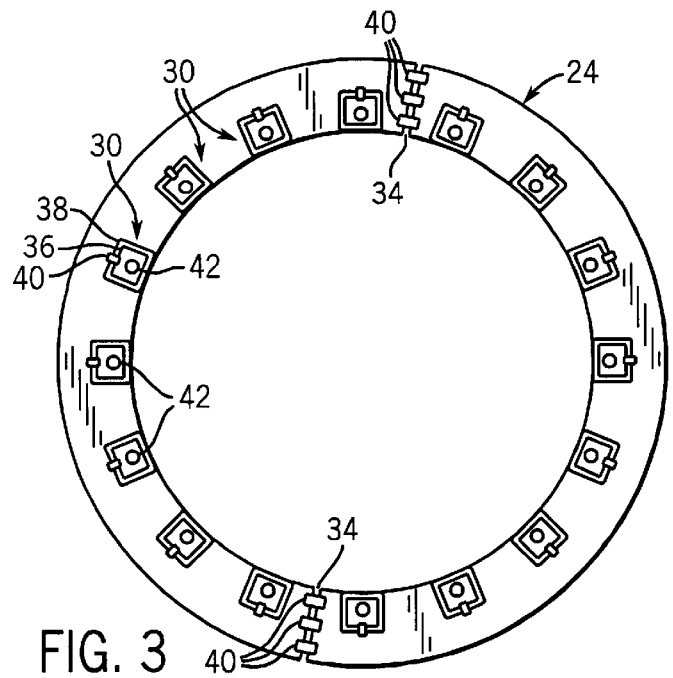
FIG. 3 is an end view of one of the annular members.

Annular member 24 comprises a rigid circuit board material, such as RT duroid with an insulating substrate thickness of 0.065 inches (1.651 mm), and a conductive layer on the outer side thereof. As best shown in FIG. 3, sixteen apertures 42 penetrate annular member 24, equally spaced around its circumference, to support the ends of sixteen conductive rods 28. Circuitry sites 30 are located on an easily accessible outer surface of annular member 24, and surround each aperture 42.

Figure 4:
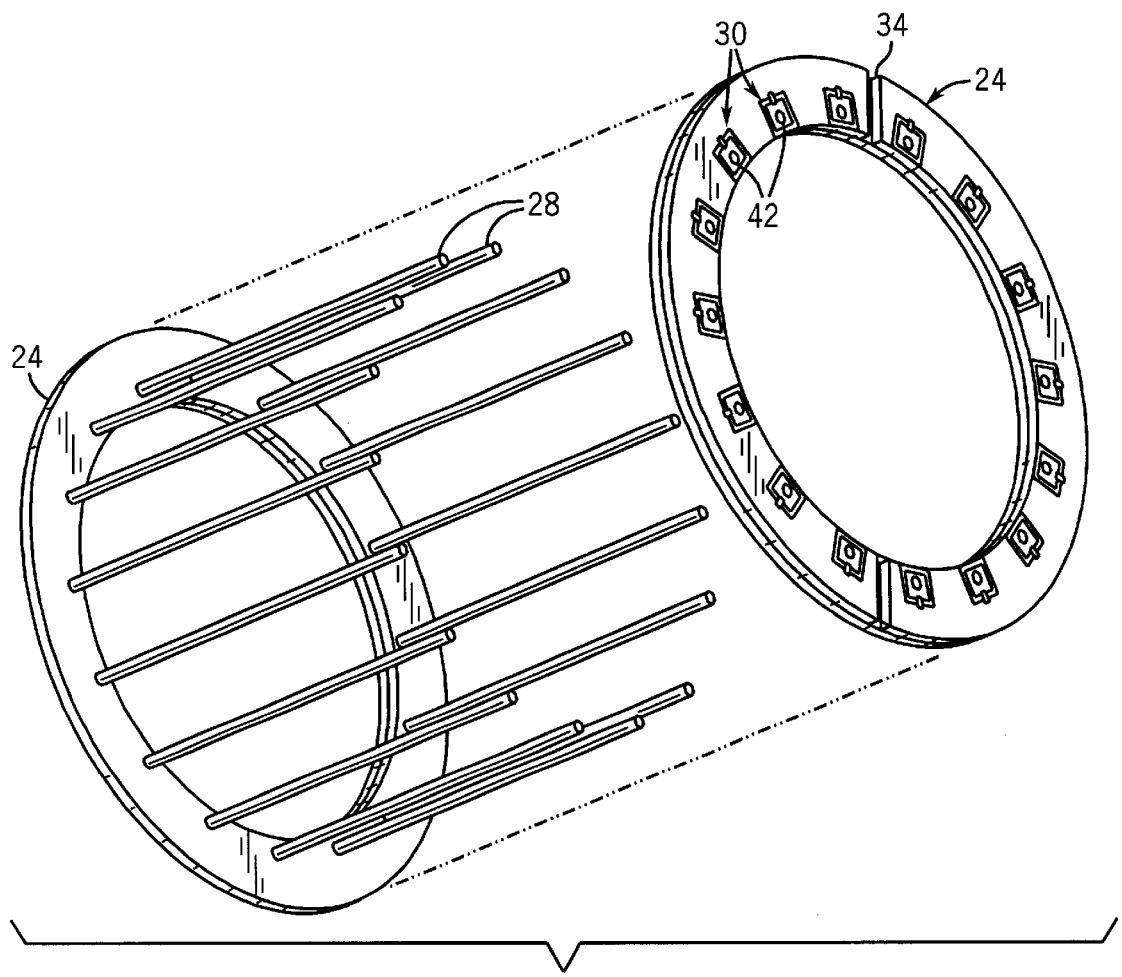
FIG. 4 is a partially exploded view of rods in between a pair of annular members.

Conventional etching techniques are used to create the circuitry sites 30. Specifically, a non-conducting gap 38 is etched through the conductive layer for each circuitry site 30, so each non-conducting gap 38 encloses the perimeter of a conductive island 36 remaining around each aperture 42. Etching also creates a pair of diametrically opposed non-conducting slots 34 through the conductive layer of annular member 24, thereby forming two crescent-shaped regions in the conductive layer, as best shown in FIGS. 3 and 4. Alternatively, slots 34 may be omitted, or more slots 34 may be used to further divide the conductive layer into more than two regions.

Lumped element circuitry is mounted to the annular member 24 and bridges each gap 38. More specifically, to compensate for the inductance of each rod 28, one or more lumped element capacitors 40 are attached across each gap 38, as required for resonant operation of coil assembly 10 as is well known in the art. Similarly, one or more lumped element capacitors 40 are attached across each slot 34, having appropriately selected combined capacitance (e.g., above 1000 picofarads/slot) to function as an open circuit at low frequencies and a short circuit at high frequencies (e.g., above 100 Megahertz). As such, use of lumped element capacitors across slots 34 interrupts direct current and low frequency continuity, but maintains radio frequency continuity.

Capacitors 40 may comprise any commercially available lumped element capacitor, though those known in the art as surface mounted or porcelain chip capacitors and commercially available from American Technical Ceramics, Inc. of Huntington Station, N.Y. are preferred. Such capacitors are preferred because they have a pair of short flat plates for connection (as opposed to wire leads) minimizing device inductance, as desired. Lumped element capacitors 40 form capacitive bridges over their respective gaps 38. Specifically, one capacitor plate is connected to its respective conductive island 36 and the other plate is connected to the conductive layer of annular member 24. In similar manner, one or more lumped element capacitors are connected to form capacitive bridges over slots 34.

Referring to FIG. 4, the front and back annular members 24 (left and right members 24, as viewed) are virtually identical, each having sixteen apertures 42 in opposing axial alignment for receiving rods 28 therebetween, sixteen corresponding circuitry sites 30, and two slots 34. The front annular member 24 differs in that two of its circuitry sites 30, located ninety degrees apart, are modified for connection to coaxial transmission lines 32, as best shown in FIG. 1. Specifically, each of the two circuitry sites 30 modified for coaxial transmission line connection include a pair of coaxial non-conducting gaps 38, with a band of the conductive layer remaining therebetween.

Conductive rods 28 are hollow tubes made from copper, though a variety of commercially available rigid conductive materials may be used. Additionally, conductive rods 28 may be solid, if desired. The ends of conductive rods 28 are soldered in place in their respective apertures 42 to make electrical contact with their respective conductive islands 36.

Figure 7:
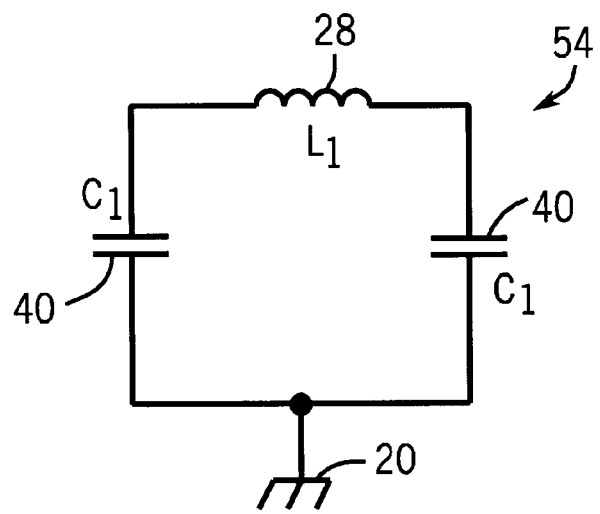
FIG. 7 is a simplified electrical schematic of a low-pass pi circuit, representative of the assemblies conductive segments.

With conductive rods 28 and lumped element capacitors 40 in place, RF coil assembly 10 provides sixteen separate conductive segments, each consisting of the well known low-pass pi circuit 54 represented in FIG. 7. In this Figure, inductance L1, capacitances C1, and ground respectively symbolize rod 28, lumped element capacitors 40, and shield 20. The low-pass pi circuits 54 are conventionally tuned to identical frequencies, producing an array of identical coupled resonators, disposed concentrically about central axis 11. As is known, such an array of resonators has formal properties resembling those of the so-called bird-cage resonator. Accordingly, the usual perturbation theory of bird-cage resonators applies, and symmetry correction in the perturbation limit can be applied to simplify tuning. Additionally, since tuning is accomplished by applying appropriate capacitance in the form of lumped element capacitors 40, the proper frequencies are easily obtained and adjusted.

The capacitance value C1 for lumped element capacitor(s) 40 is selected in accordance with established principles governing the operation of bird-cage resonators. Specifically, it is known that bird-cage resonators have several resonant modes, of which only one (the "useful mode") produces a uniform magnetic field of value in magnetic resonance imaging. The frequency of the useful mode bears a calculable relationship to the frequency of an individual isolated LC circuit (e.g., low-pass pi circuit 54). Formulas for the required calculations are well known to those skilled in the art as disclosed in "Mutual Inductance in the Bird-Cage Resonator" by James Tropp in *Journal of Magnetic Resonance* 126, 9–17 (1997).

Figure 6:
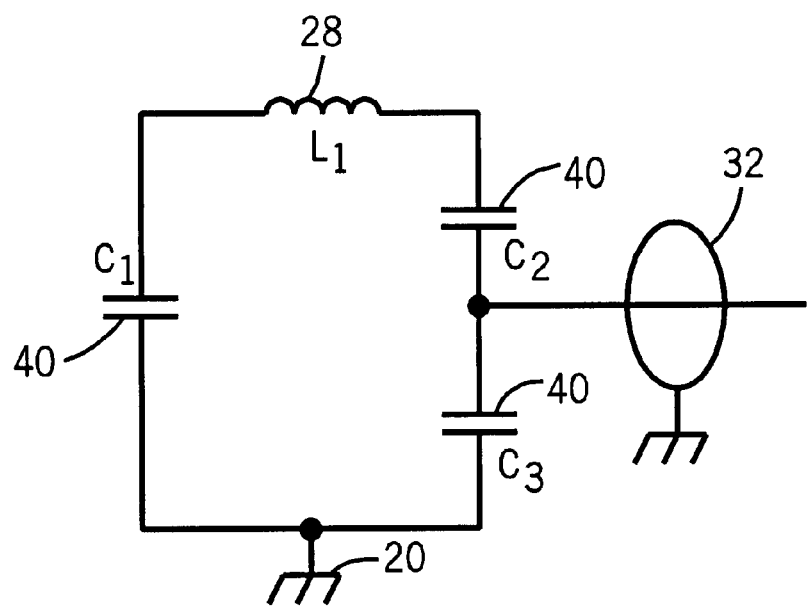
FIG. 6 is a simplified electrical schematic of the low-pass pi circuit of FIG. 7 modified to show transmission line connection.

Referring to FIG. 6, an electrical schematic is shown for the two circuitry sites 30 modified for connection to coaxial transmission lines 32. In this Figure, inductance L1, capacitance C1, and ground respectively represent rod 28, lumped element capacitor(s) 40 (on the back annular member 24), and shield 20. Capacitances C2 and C3 symbolize lumped element capacitors 40 located on the front annular member 24. Specifically, lumped element capacitor(s) 40 representing capacitance C2 have one plate connected to conductive island 36 which is soldered to rod 28, and the other plate connected to the band of conductive layer between the pair of coaxial gaps 38. Lumped element capacitor(s) 40 representing capacitance C3 have one plate connected to the inter-gap conductive layer, and the other plate connected to the conductive layer outside of the outermost gap 38, which is connected to shield 20. The inner cable of coaxial transmission line 32 is connected to the shared node between capacitances C2 and C3, while the outer cable is connected to ground. Any one of a number of well known driver circuits may be used to produce RF driver signals through coaxial transmission lines 32.

Once capacitance value C1 is chosen, the following relationships hold for capacitance values C2 and C3:

$$C1=(C2*C3)/(C2+C3); \qquad \text{Eqn. 1}$$

and $$\omega*C3=\sqrt{(1/50*R)} \qquad \text{Eqn. 2}$$

Where $\omega$ is $2\pi v$ and $v$ is the resonant frequency of the useful mode (i.e., the Larmor frequency), and R is the equivalent series resistance of the resonator when operating in pure excitation of the useful mode. This assumes operation in an RF system with 50 ohm characteristic input impedance.

As previously mentioned, one or both of the outer circumferential surfaces 16 (see FIG. 1) may be used to mount a grounding strip, such as a strip of conductive material adhered to surface 16. The grounding strip would be conventionally connected to one or more portions of annular member 24 in electrical communication with shield 20. The purpose of the grounding strip(s) is to provide an electrostatic shield between a patient within the resonant volume, and the high impedance points of the low-pass pi circuits, where their respective inductances and capacitances are joined.

Figure 5:
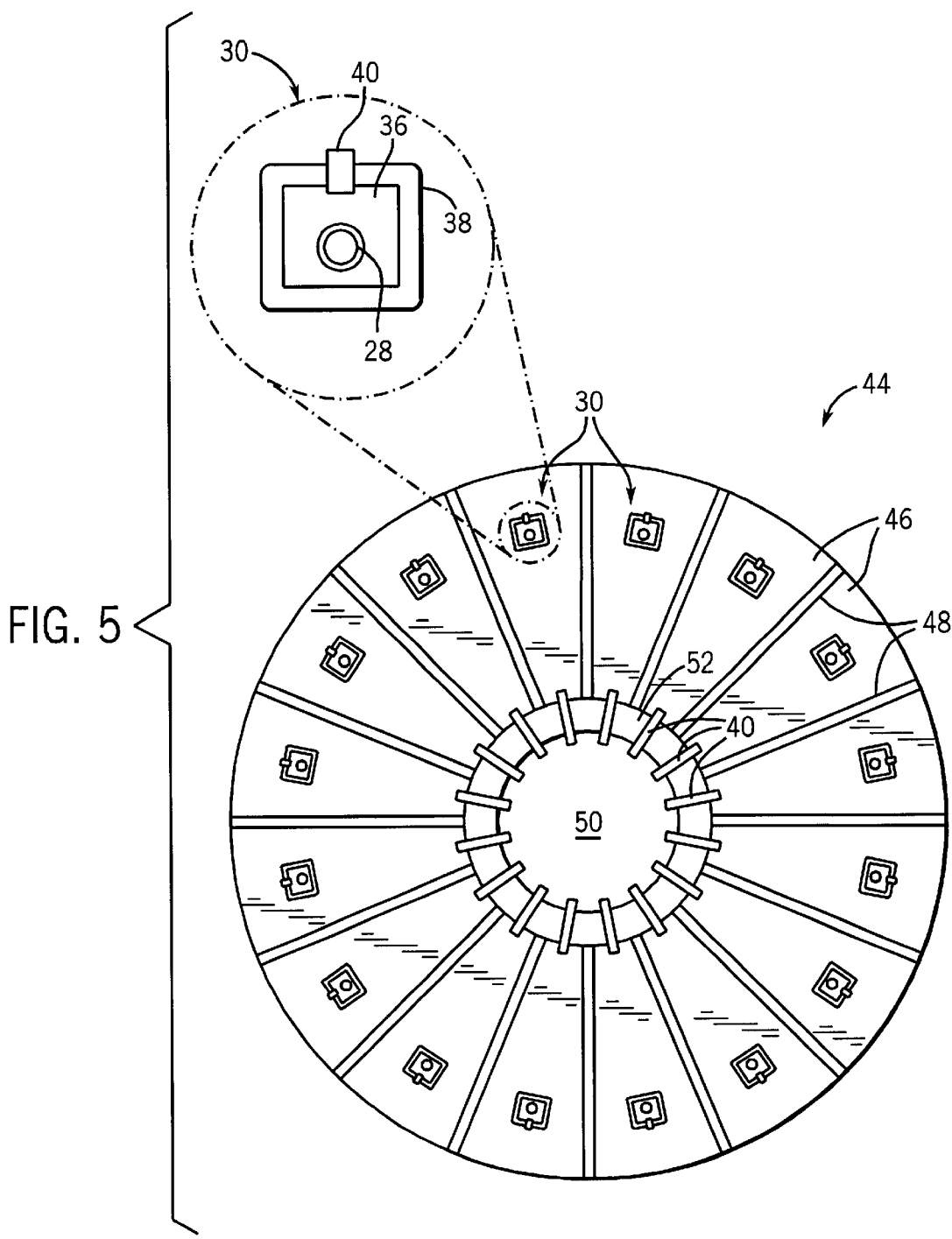
FIG. 5 is an end view of an end cap.

Referring to FIG. 5, an end cap 44 is depicted that may be used in lieu of the back end annular member 24. In this case, the back end lip 14 (see FIG. 1) would preferably not be used, permitting flush engagement of the end cap 44 against inner cylinder 12 and outer cylinder 18. End cap 44 functions as an RF mirror, limiting signal leakage through the back end of RF coil assembly 10 by closing the opening that would otherwise exist with use of the back end annular member 24.

End cap 44 comprises a disc of rigid circuit board material, such as RT duroid with an insulating substrate of desired thickness, and a conductive layer on the outer side thereof. Apertures 42 and circuitry sites 30 are provided in end cap 44, as they were for annular member 24. In addition, sixteen conductive sectors 46 are formed by etching radial slots 48 through the conductive surface of end cap 44. The radial slots 48 intersect with a centrally located circular slot 52 through the conductive layer. Sixteen lumped element capacitors 40 bridge across circular slot 52, making respective connection between the sixteen conductive sectors 46 and a common conductive surface 50. These lumped element capacitors 40 are appropriately selected to interrupt DC and low frequency continuity, while maintaining radio frequency continuity.

End cap 44 is connected to the back end of RF coil assembly 10 using any conventional technique. For example, a non-conductive plug located on the back side of end cap 44 may be inserted into the annular cavity between inner 12 and outer 18 cylinders, and attached with adhesive. Additionally, each conductive sector 46 is coupled with a conductive tab 26 to a respective conductive panel of shield 20.

The apparatus of the present invention permits tuning the RF coil assembly to resonance with ease and efficiency. This is accomplished by using lumped element, as opposed to distributed, capacitance to tune the assembly. Additionally, certain portions of the assembly permit easy access to sites for mounting the lumped element capacitors. These mounting portions are made from an insulating substrate having a conductive layer with a pattern of non-conducting gaps formed through the conductive layer.

Additionally, the apparatus of the present invention substantially reduces radiative loss of RF magnetic field. This is accomplished by using a shield fitting around the irradiated volume. Moreover, an end cap may be used to further limit such losses.

The foregoing descriptions of the specific embodiments will so fully reveal the general nature of the invention that others can, by applying current knowledge, readily modify and/or adapt the embodiments for various applications without departing from the generic concept. Therefore, such adaptations and modifications should, and are intended to be comprehended within the meaning and range of equivalents of the disclosed embodiments.

It is to be understood that the phraseology or terminology employed herein is for the purpose of description, and not of limitation. Accordingly, the invention is intended to embrace all such alternatives, modifications, equivalents, and variations as fall within the spirit and broad scope of the appended claims.

What is claimed is:

1. An RF coil assembly for an NMR instrument which comprises:
   a) a cylindrical shield disposed concentrically about a central axis and defining a cylindrical cavity into which a subject to be examined is subjected to an RF field;
   b) a set of linear conductors which are disposed concentrically about the central axis and radially inward from the shield, each linear conductor being oriented in substantially the same direction as the central axis;
   c) an annular member connected to one end of the cylindrical shield and extending radially inward therefrom to provide support for one end of each of the linear conductors, said annular member providing electrical connection between the cylindrical shield and a set of circuitry sites associated with one end of the respective linear conductors, each circuitry site defining an insulating gap;
   d) a lumped element capacitor connected across at least one of the gaps;
   e) an end cap connected to the other end of the cylindrical shield and extending radially inward therefrom to provide support for the other end of the linear conductors and to provide an RF mirror which limits signal leakage through the other end of the cylindrical shield, said end cap providing electrical connection between the cylindrical shield and a set of circuitry sites associated with the other end of the respective linear conductors, each circuitry site defining an insulating gap; and
   f) a lumped element capacitor connected across at least one of the gaps formed on the end cap.

2. The RF coil assembly as recited in claim 1 in which at least one lumped element capacitor is connected across the gap in each circuitry site.

3. The RF coil assembly as recited in claim 1 in which the gaps are situated in an outer surface of the assembly, easily accessible to a user.

4. The RF coil assembly as recited in claim 1 in which the annular member includes an insulating substrate, and a conductive layer over the substrate, with the insulating gaps penetrating through the conductive layer.

5. The RF coil assembly as recited in claim 4 in which the annular member further includes a plurality of apertures equally-spaced around its periphery, each aperture's perimeter abutting with and being circumscribed by a conductive island formed in the conductive layer by a respective gap which bounds the island's outer perimeter.

6. The RF coil assembly as recited in claim 1 further including an inner cylindrical member of insulating material, coaxial with the cylindrical shield and forming therebetween an annular cavity.

7. The RF coil assembly as recited in claim 6 in which the inner cylindrical member's axial length exceeds that of the cylindrical shield, forming thereby a lip with an external mounting surface protruding from at least one end of the assembly.

8. The RF coil assembly as recited in claim 6 in which the linear conductors are rods suspended within the annular cavity.

9. The RF coil assembly as recited in claim 1 in which the cylindrical shield includes an insulating substrate, a conductive surface over the substrate, and a series of non-conducting slots running axially through the conductive surface.

10. The RF coil assembly as recited in claim 9 in which the slots form therebetween a plurality of conductive panels, collectively representing the cylindrical shield.

11. The RF coil assembly as recited in claim 10 in which an equal number of conductive panels and linear conductors are used.

12. An RF coil assembly for an NMR instrument which comprises:
   a) a cylindrical shield disposed concentrically about a central axis and defining a cylindrical cavity into which a subject to be examined is subjected to an RF field;

b) a set of linear conductive rods which are disposed concentrically about the central axis and radially inward from the shield, each linear conductive rod being oriented in substantially the same direction as the central axis;

c) a pair of annular members each connected to a separate end of the cylindrical shield and extending radially inward therefrom to provide support for both ends of the linear conductive rods, said annular members each providing electrical connection between the cylindrical shield and a respective set of circuitry sites associated with respective linear conductive rods, each circuitry site defining an insulating gap; and d) a lumped element capacitor connected across each of the gaps providing capacitance sufficient for resonant operation of the assembly.

13. The RF coil assembly as recited in claim 12 in which an aperture is formed in each annular member at each circuitry site and the ends of the linear conductive rods are supported in said apertures.

* * * * *